(12) United States Patent
Lee et al.

(10) Patent No.: US 7,994,050 B2
(45) Date of Patent: *Aug. 9, 2011

(54) METHOD FOR FORMING DUAL DAMASCENE PATTERN

(75) Inventors: Ki Lyoung Lee, Hwaseong-si (KR); Jung Gun Heo, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/804,150

(22) Filed: Jul. 15, 2010

(65) Prior Publication Data
US 2010/0311239 A1    Dec. 9, 2010

Related U.S. Application Data

(62) Division of application No. 11/812,910, filed on Jun. 22, 2007, now Pat. No. 7,811,929.

(30) Foreign Application Priority Data

Dec. 21, 2006  (KR) .................. 10-2006-0132045

(51) Int. Cl.
*H01L 21/768*  (2006.01)
(52) U.S. Cl. .. 438/637; 438/672; 438/675; 257/E21.579
(58) Field of Classification Search .................. 438/637, 438/672, 675; 257/E21.579
See application file for complete search history.

(56) References Cited

U.S. PATENT DOCUMENTS

| | | | | |
|---|---|---|---|---|
| 5,750,587 A * | 5/1998 | Manzouji et al. | ............... | 522/15 |
| 6,583,047 B2 * | 6/2003 | Daniels et al. | ............... | 438/623 |
| 6,638,871 B2 * | 10/2003 | Wang et al. | .................. | 438/694 |
| 6,669,858 B2 * | 12/2003 | Bjorkman et al. | ............... | 216/72 |
| 6,924,228 B2 * | 8/2005 | Kim et al. | ...................... | 438/636 |
| 7,241,853 B2 * | 7/2007 | King et al. | ........................ | 528/31 |
| 7,300,597 B2 * | 11/2007 | Chae et al. | ....................... | 216/66 |
| 7,309,448 B2 * | 12/2007 | Chae et al. | ....................... | 216/66 |
| 2002/0081834 A1 * | 6/2002 | Daniels et al. | ................ | 438/624 |
| 2002/0142586 A1 * | 10/2002 | Shiota | ........................... | 438/633 |
| 2002/0177070 A1 | 11/2002 | Kozawa et al. | | |
| 2004/0183203 A1 * | 9/2004 | Meagley et al. | ............... | 257/774 |

(Continued)

FOREIGN PATENT DOCUMENTS

CN    1279603    10/2006

(Continued)

*Primary Examiner* — David Vu
*Assistant Examiner* — Earl N Taylor
(74) *Attorney, Agent, or Firm* — IP & T Group LLP

(57) ABSTRACT

A method for forming a dual damascene pattern includes preparing a multi-functional hard mask composition including a silicon resin as a base resin, wherein the silicon resin comprises about 20 to 45% silicon molecules by weight, based on a total weight of the resin; forming a deposition structure by sequentially forming a self-arrangement contact (SAC) insulating film, a first dielectric film, an etching barrier film, and a second dielectric film over a hardwiring layer; etching the deposition structure to expose the hardwiring layer, thereby forming a via hole; coating the multi-functional hard mask composition over the second dielectric film and in the via hole to form a multi-functional hard mask film; and etching the resulting structure to expose a part of the first dielectric film using a photoresist pattern as an etching mask, thereby forming a trench having a width greater than that of the via hole.

17 Claims, 15 Drawing Sheets
(2 of 15 Drawing Sheet(s) Filed in Color)

U.S. PATENT DOCUMENTS

| | | | |
|---|---|---|---|
| 2005/0029229 A1* | 2/2005 | Chae et al. | 216/67 |
| 2005/0124152 A1* | 6/2005 | Meagley et al. | 438/631 |
| 2005/0266691 A1* | 12/2005 | Gu et al. | 438/706 |
| 2006/0046467 A1* | 3/2006 | Verhaverbeke | 438/637 |
| 2006/0148243 A1* | 7/2006 | Wang | 438/638 |
| 2006/0183348 A1* | 8/2006 | Meagley et al. | 438/789 |
| 2007/0037396 A1* | 2/2007 | Verhaverbeke | 438/689 |
| 2007/0235684 A1* | 10/2007 | Mistkawi et al. | 252/79.1 |
| 2008/0268641 A1* | 10/2008 | Lee et al. | 438/674 |

FOREIGN PATENT DOCUMENTS

| | | |
|---|---|---|
| EP | 735066 A2 * | 10/1996 |
| EP | 739945 A2 * | 10/1996 |
| EP | 842996 A1 * | 5/1998 |
| JP | 2005-72615 | 3/2005 |
| JP | 2005-315985 | 11/2005 |

* cited by examiner

METHOD FOR FORMING DUAL DAMASCENE PATTERN

CROSS-REFERENCES TO RELATED APPLICATIONS

This application is a division of U.S. patent application Ser. No. 11/812,910 filed on Jun. 22, 2007, now U.S. Pat. No. 7,811,929 which claims priority of Korean patent application number 10-2006-0132045 filed on Dec. 21, 2006. The disclosure of each of the foregoing applications is incorporated herein by reference in its entirety.

BACKGROUND

The present invention relates generally to semiconductor processing. More particularly, the present invention relates to a method for forming a dual damascene pattern.

As the semiconductor industry develops Ultra Large Scale Integration (ULSI) devices, reducing a device to a sub-half-micron size increases the circuit density, thereby causing a resistance-capacitance (RC) delay and copper reactive ion etching (RIE). In a process for forming a bit line pattern for devices of a reduced size, the pattern may be bridged or collapsed.

In order to prevent bridging and/or collapsing of the pattern and to improve the layout of the device, a dual damascene process has been developed. The dual damascene process can be used when it is impossible to pattern a metal material by a conventional etching technology due to the reduction of the device size, or it is difficult to fill a low dielectric material in a deep contact etching process for forming a conventional metal line.

By the dual damascene process, a contact line structure is formed. The contact line structure may include an aluminum metal line and an oxide film. Alternatively, the contact line structure may include a copper metal line and a low dielectric constant (low-k) material for reducing the RC delay in a LSI process.

Instead of a deposition structure including polysilicon, tungsten, a nitride film, and an oxide film as a hard mask, a deposition structure including an insulating film and an amorphous carbon layer is used in an etching process for forming a pattern of below 80 nm for semiconductor devices of a smaller size. The deposition structure secures an etching selectivity to a lower layer and has a faster etching speed than that of a photoresist and an antireflection film.

However, a process using the insulating film/amorphous carbon layer is complicated. In addition, the manufacturing cost is high, because a chemical vapor deposition (CVD) process is involved.

Recently, a multi-functional hard mask film, which serves as an organic anti-reflection film and a hard mask film, is developed to simplify the process.

SUMMARY

Various embodiments consistent with the present invention are directed to providing a method for forming a dual damascene pattern.

In one aspect, there is provided a method for forming a dual damascene pattern comprising a via pattern, which includes filling a via contact hole with a multi-functional hard mask composition containing a large amount of silicon molecules, thereby simplifying the process for forming a metal line.

According to one embodiment, a method for forming a dual damascene pattern comprises: preparing a multi-functional hard mask composition including a silicon resin as a base resin, wherein the silicon resin comprises about 20 to 45% silicon molecules by weight, based on a total weight of the resin, forming a deposition structure by sequentially forming a self-arrangement contact (SAC) insulating film, a first dielectric film, an etching barrier film, and a second dielectric film over a hardwiring layer, etching the deposition structure to expose the hardwiring layer, thereby forming a via hole, coating the multi-functional hard mask composition over the second dielectric film and in the via hole to form a multi-functional hard mask film, and etching the resulting structure to expose a part of the first dielectric film using a photoresist pattern as an etching mask, thereby forming a trench having a width greater than that of the via hole.

The method further comprises filling a metal material in the trench by a subsequent process to form a metal line, after removing the multi-functional hard mask film.

BRIEF DESCRIPTION OF THE DRAWINGS

The patent or application file contains at least one drawing executed in color. Copies of this patent or patent application publication with drawings will be provided by the Office upon request and payment of the necessary fee.

DETAILED DESCRIPTION

Figure 1A:
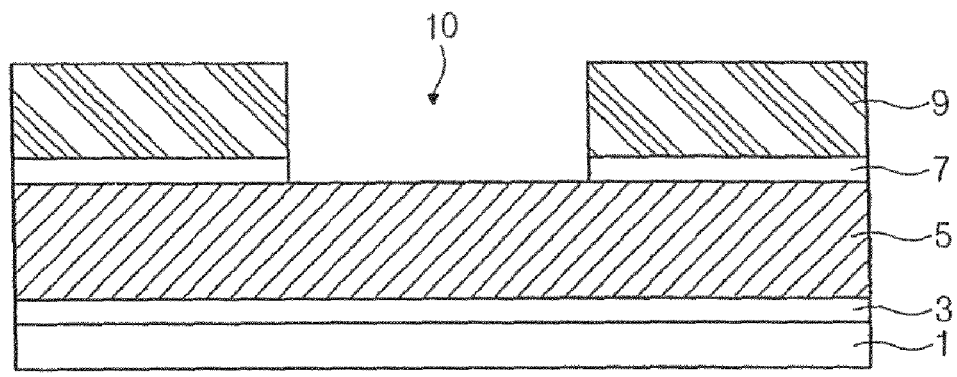
FIGS. 1a through 1d are cross-sectional diagrams illustrating a method for forming a dual damascene pattern comprising a trench pattern.
Figure 1B:
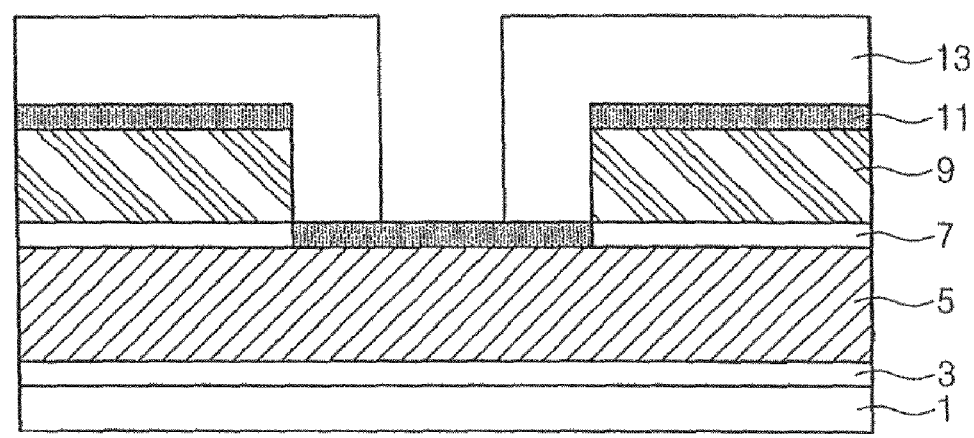
Figure 1C:
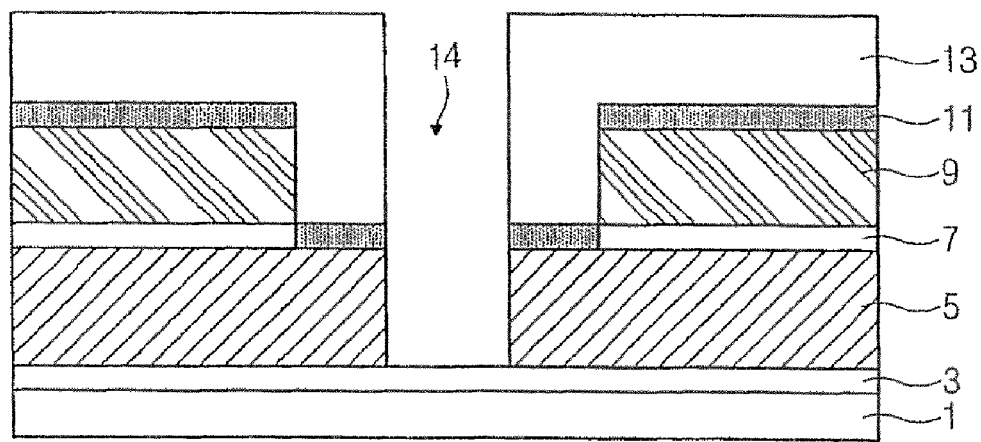
Figure 1D:
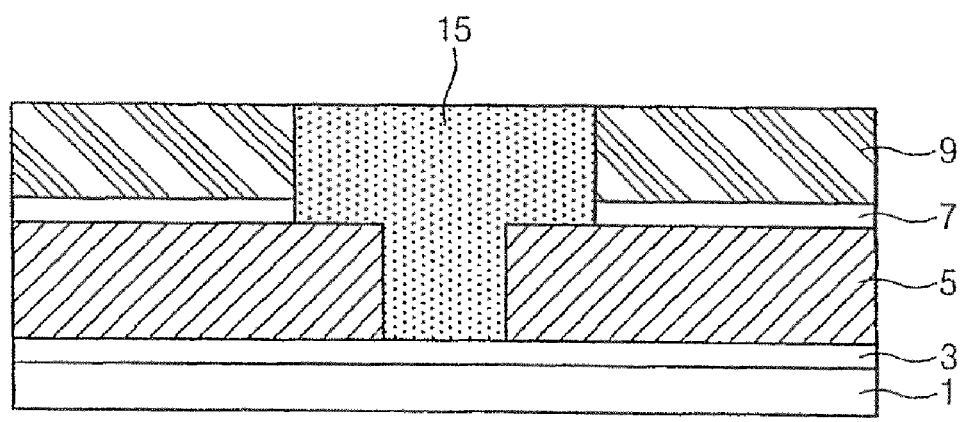
Figure 2A:
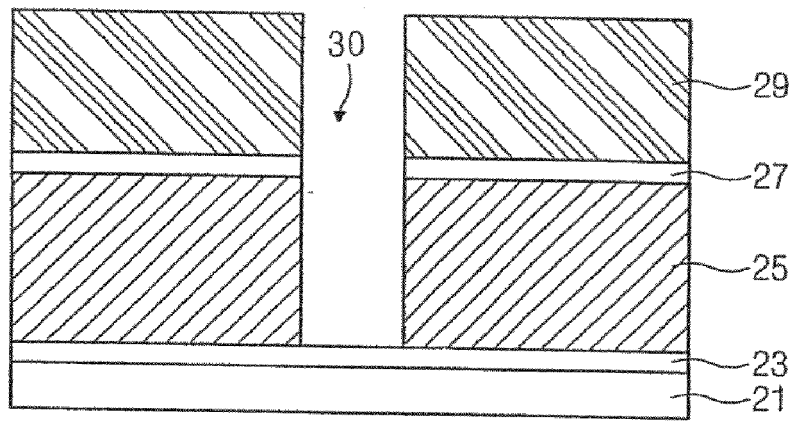
FIGS. 2a through 2d are cross-sectional diagrams illustrating a method for forming a dual damascene pattern comprising a via pattern.
Figure 2B:
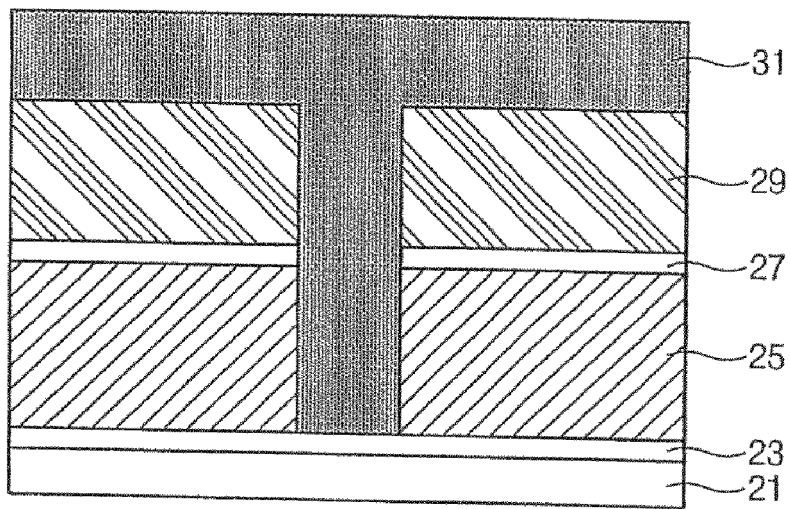
Figure 2C:
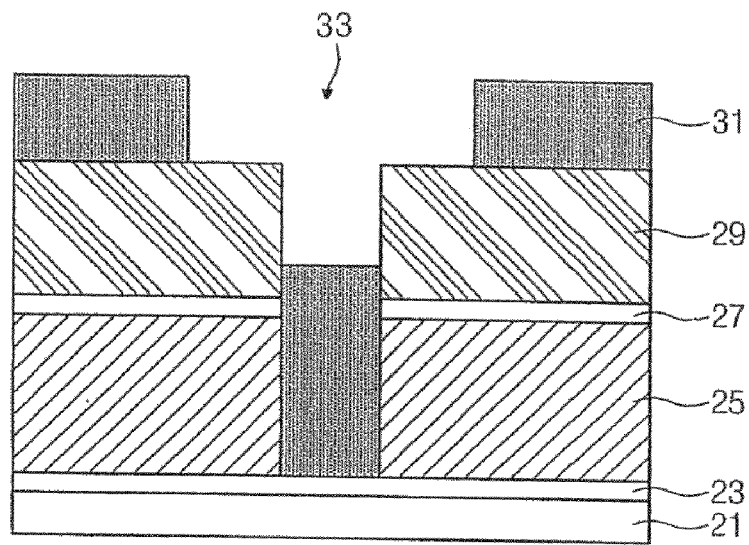
Figure 2D:
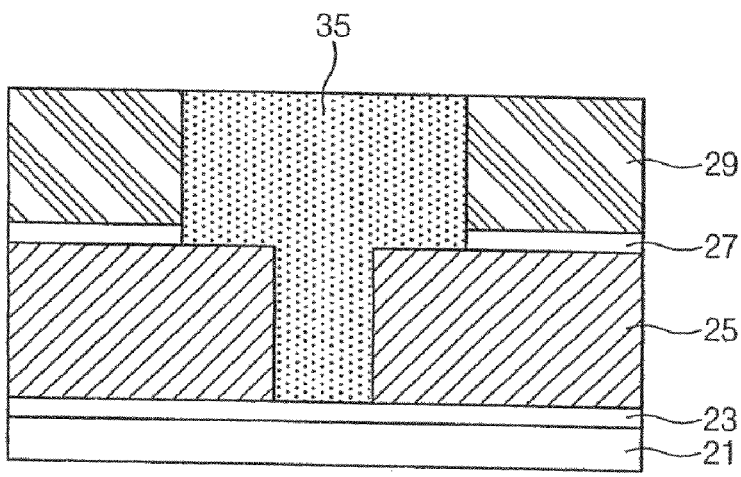
Figure 3A:
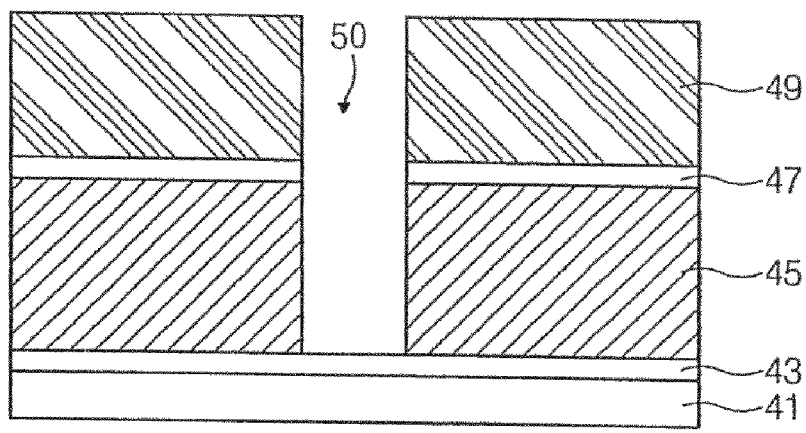
FIGS. 3a through 3f are cross-sectional diagrams illustrating a method for forming a dual damascene pattern comprising a via pattern.
Figure 3B:
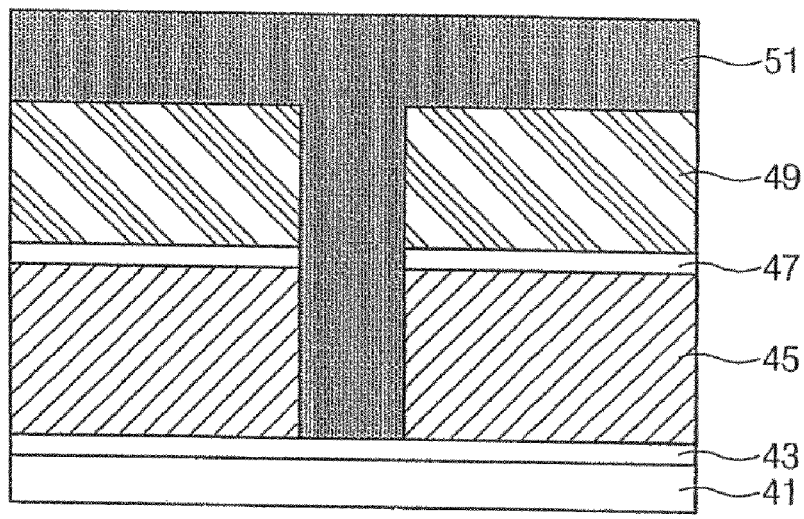
Figure 3C:
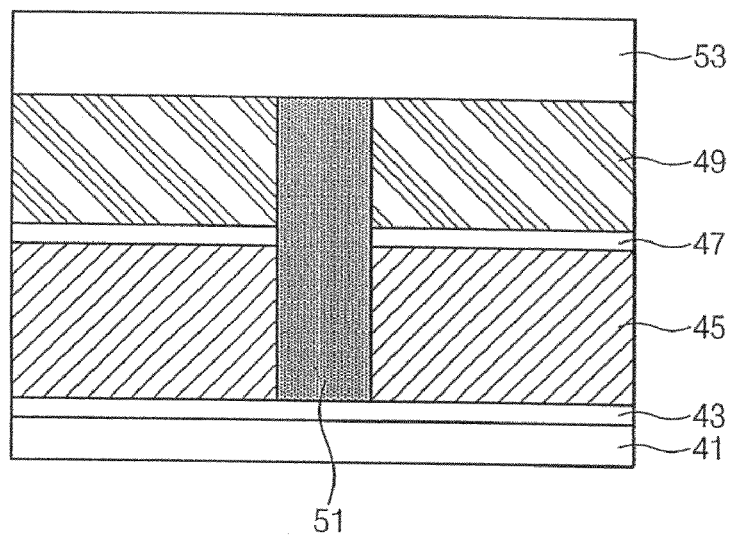
Figure 3D:
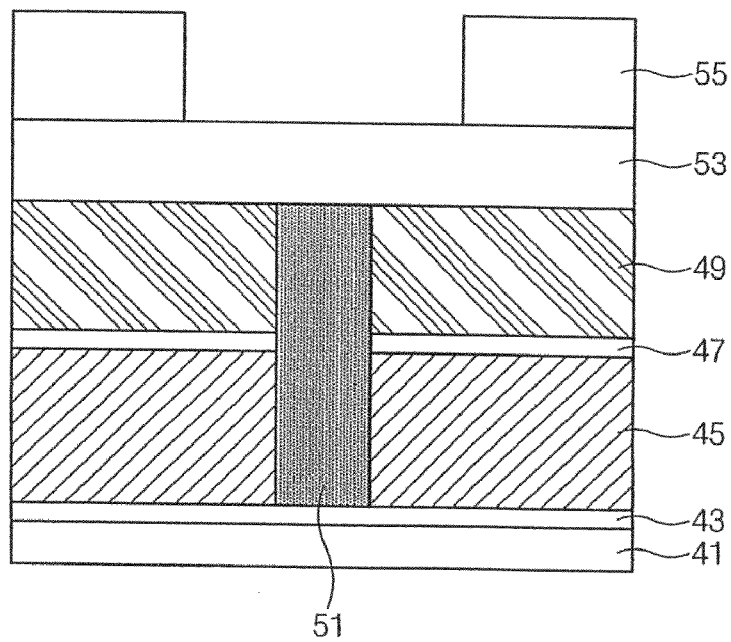
Figure 3E:
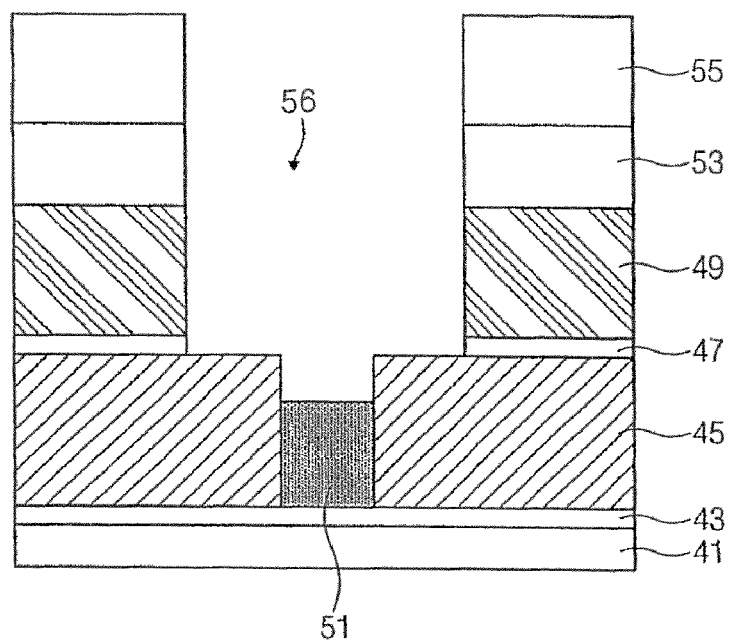
Figure 3F:
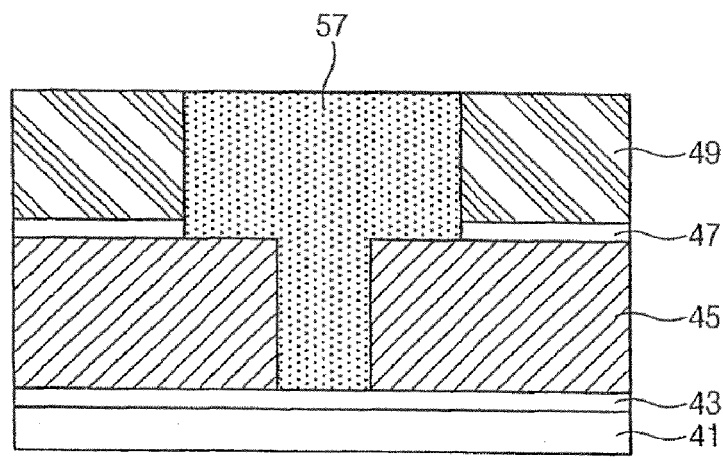

A dual damascene process may include forming a dual damascene pattern comprising a trench pattern or a via pattern depending on structures obtained by an etching process.

FIGS. 1a through 1d are cross-sectional diagrams illustrating a method for forming a dual damascene pattern comprising a trench pattern.

The method includes forming a self-align contact (SAC) insulating film 3 over a hardwiring layer 1, forming a first low dielectric film 5 over SAC insulating film 3, forming a nitride film 7 over first low dielectric film 5, forming a second low dielectric film 9 on nitride film 7. The method further includes an etching process, which is performed on nitride film 7 and second dielectric film 9 to expose a part of first dielectric film 5, thereby forming a trench 10 (see FIG. 1a). An anti-reflection film 11 is formed on the second low dielectric film 9 and the exposed part of first dielectric film 5, and a photoresist film 13 is formed on the anti-reflection film 11 and filled in trench 10 with a portion of anti-reflection film 11 in trench 10 being exposed. The exposed portion of anti-reflection film 11 has an area smaller than that of the previously exposed part of first dielectric film 5. Further, an etching process is performed on the resultant structure to expose a part of hardwiring layer 1, thereby forming a via hole 14 having a smaller width than that of trench 10 (see FIGS. 1b and 1c). The anti-reflection film 11 and photoresist film 13 are removed, and a metal material 15 is formed on the structure to form a metal line (see FIG. 1d).

In order to obtain a lower k (dielectric constant) value, first and second dielectric films 5 and 9 may include a porous dielectric material having a higher etching speed than that of a conventional dielectric film. As a result, the porous dielectric material may be unstable, because the etching speed of the porous dielectric material is faster than the etching speed of the photoresist material of photoresist film 13 that filled trench 10.

FIGS. 2a through 2d are cross-sectional diagrams illustrating a method for forming a dual damascene pattern comprising a via pattern.

The method includes forming an SAC insulating film 23 on a hardwiring layer 21, forming a first low dielectric film 25 on SAC insulating film 23, forming a nitride film 27 on first low dielectric film 25, and forming a second low dielectric film 29 on nitride film 27. The method further includes an etching process, which is performed on SAC insulating film 23, the first low dielectric film 25, nitride film 27, and second low dielectric film 29 to expose a part of hardwiring layer 21, thereby forming a via hole 30 (see FIG. 2a). An anti-reflection film (not shown) and a photoresist film 31 are formed over second dielectric film 29 including via hole 30 (see FIG. 2b). Photoresist film 31 is formed over the anti-reflection film. The resulting structure is etched using the photoresist film 31 as an etching mask to expose a part of first dielectric film 25, thereby forming a trench 33 (see FIG. 2c). A washing process is performed on the resulting structure to remove the anti-reflection film and photoresist film 31. And a metal material 35 is formed on the resulting structure to form a metal line in trench 33 and via hole 30 (see FIG. 2d).

A subsequent etching process for forming a trench is unstable, because the photoresist material of photoresist film 31 used in the above method has a low etching selectivity.

FIGS. 3a through 3f are cross-sectional diagrams illustrating a method for forming a dual damascene pattern comprising filling a via contact hole with a general gap fill material.

The method includes forming an SAC insulating film 43 over a hardwiring layer 41, forming a first low dielectric film 45 over SAC insulating film 43, forming a nitride film 47 over first low dielectric film 45, and forming a second low dielectric film 49 over nitride film 47. SAC insulating film 43, first low dielectric film 45, nitride film 47, and second low dielectric film 49 are etched to expose hardwiring layer 41, thereby forming a via hole 50 (see FIG. 3a). A gap fill material 51 is formed over the second dielectric film 49 and in via hole 50 (see FIG. 3b). A planarization process is performed on the resulting structure to expose second dielectric film 49 and gap fill material 51 (see FIG. 3c). An anti-reflection film 53 is formed on the exposed second dielectric film 49 and gap fill material 51, and a photoresist pattern 55 is formed on anti-reflection film 53 (see FIG. 3d). An etching process is performed over the resulting structure using photoresist pattern 55 as an etching mask to expose first low dielectric film 45, thereby forming a trench 56 having a larger width than that of via hole 50 (see FIG. 3e). A washing process is performed on the resulting structure to remove anti-reflection film 53 and photoresist pattern 55. And, a metal material 57 is formed on the resulting structure to form a metal line (see FIG. 3f).

The method described above includes forming an anti-reflection film, because gap fill material 51 does not control a substrate reflectivity like a conventional anti-reflection film. As a result, the process is complicated.

In a specific embodiment consistent with the present invention, a multi-functional hard mask composition comprises: i) a silicon resin present in an amount ranging from about 30 to 70 parts by weight based on the total weight of the composition; and ii) the residual organic solvent as main elements. The composition may optionally further comprise: iii) a compound represented by Formula 1 or 2 (below); and/or iv) a thermal acid generator or a photoacid generator.

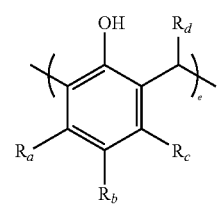

[Formula 1]

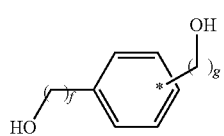

[Formula 2]

wherein $R_a$~$R_d$ may individually be a hydrogen (H) or a linear or branched $C_1$~$C_5$ alkyl group, which may be substituted, e is an integer ranging from 5 to 500, f is an integer ranging from 0 to 5, and g is an integer ranging from 1 to 5.

The molecular weight of the compound represented by Formula 1 ranges from about 500 to 50,000. The hydroxyl compound of Formula 2 preferably has a molecular weight ranging from about 100 to 10,000. The hydroxyl compound is represented by a compound including a benzene ring and a diol structure. For example, the hydroxyl compound is represented by resorcinol or 1,4-benzenedimethanol. Preferably, the compound represented by Formula 1 or 2 is present in an amount ranging from about 20 to 200 parts by weight based on 100 parts by weight of the silicon resin. The hydroxyl compound is present in an amount ranging from about 10 parts by weight to 80 parts by weight, based on 100 parts by weight of the silicon compound of Formula 1.

The silicon resin includes a silicon (Si) molecule present in an amount ranging from about 20 to 45 wt % based on the total weight of the resin. The molecular weight of the silicon resin ranges from about 300 to 30,000.

The silicon resin includes one or more selected from compounds represented by Formulas 3 through 7 (below) as a base resin.

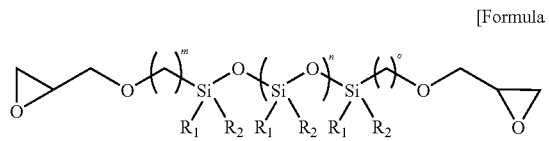

[Formula 3]

wherein $R_1$~$R_2$ may individually be a hydrogen (H) or a linear or branched $C_1$~$C_5$ alkyl group, which may be substituted, and m, n, and o are integers ranging from 1 to 10.

[Formula 4]

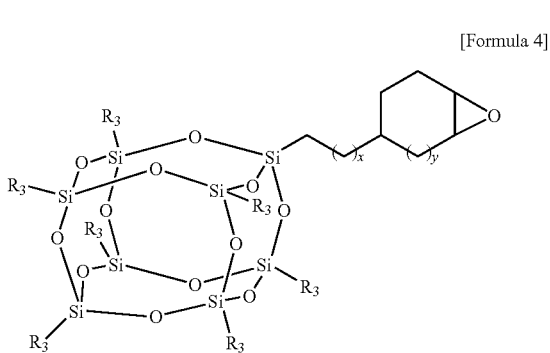

wherein $R_3$ may be a hydrogen (H) or a linear or branched $C_1\sim C_5$ alkyl group, which may be substituted, a $C_3\sim C_8$ cycloalkyl group, which may be substituted, or a $C_5\sim C_{12}$ aromatic group, which may be substituted, and x and y are integers ranging from 0 to 5.

[Formula 5]

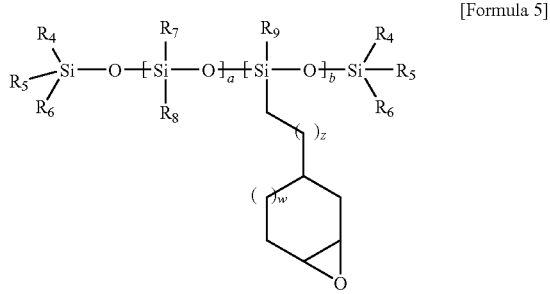

wherein $R_4\sim R_9$ are individually H or a linear or branched $C_1\sim_5$ alkyl group which is substituted or not, a and b are an integer ranging from 1 to 100, and w and z are an integer ranging from 0 to 5.

[Formula 6]

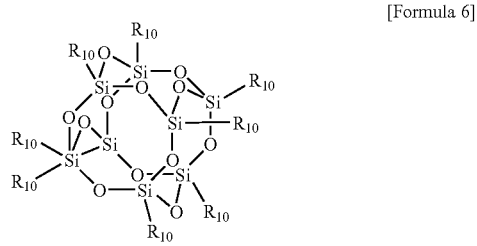

wherein $R_{10}$ is $(CH_2)_kSi(OR')_3$, R' may be a hydrogen (H) or a linear or branched $C_1\sim C_{10}$ alkyl group, and k is an integer ranging from 1 to 10.

[Formula 7]

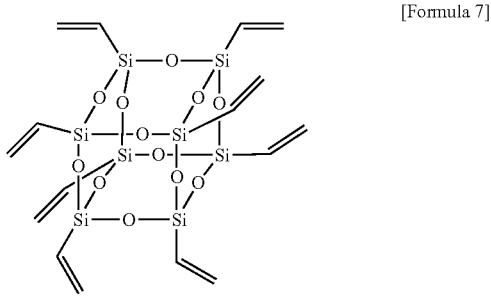

For example, Formula 4 may be PSS-[2-(3,4-epoxycyclohexyl)ethyl]-heptaisobutyl substituted, Formula 5 may be poly[dimethylsiloxane-co-(2-(3,4-epoxycylohexyl)ethyl) methylsiloxane], Formula 6 may be PSS-octa(trimethoxysilylmethyl) substituted or PSS-octa(trimethoxysilylethyl) substituted PSS. In one embodiment, NCH 087 (Nissan Industrial Chemical) may be used.

The organic solvent is selected from the group consisting of methyl 3-methoxypropionate, ethyl 3-ethoxypropionate, propyleneglylcol methyletheracetate, cyclohexanone, 2-heptanone, ethyl lactate, and combinations thereof.

The thermal acid generator or photoacid generator is present in an amount ranging from about 1 to 20 parts by weight of 100 parts by weight of the silicon resin. The thermal acid generator is selected from the group consisting of Formulas 8 and 9.

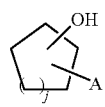

[Formula 8]

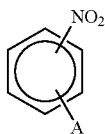

[Formula 9]

wherein A is a functional group including a sulfonyl group, and j is 0 or 1. The sulfonyl group is

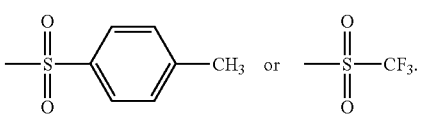

For example, the thermal acid generator may be 2-hydroxylhexyl p-toluenylsulfonate.

The photoacid generator is selected from the group consisting of phthalimidotrifluoro methanesulfonate, dinitrobenzyltosylate, n-decyldisulfone, naphthylimidotrifluoro methanesulfonate, diphenyl p-methoxyphenyl sulfonium triflate, diphenyl p-toluenyl sulfonium triflate, diphenyl p-isobutylphenyl sulfonium triflate, triphenyl hexafluoro arsenate, triphenylhexafluoro antimonite, triphenylsulfonium triflate, and dibutylnaphthylsulfonium triflate.

The multi-functional hard mask film may contain a large amount of Si in order to secure the etching resistance to the amorphous carbon layer or the lower layer. The multi-functional hard mask film is not affected by topology, because the multi-functional hard mask film is formed by a spin coating method. Furthermore, the multi-functional hard mask film may include a polymer having a hydroxyl group for cross-linking in the composition, a catalyst such as a cross-linker, a thermal acid generator and a photoacid generator for activating the cross-linking, and an optic absorbent having a large optical density in a wavelength band of an exposure light source.

FIGS. 4a through 4e are cross-sectional diagram illustrating a method for forming a dual damascene pattern according to a specific embodiment consistent with the present invention.

Figure 4A:
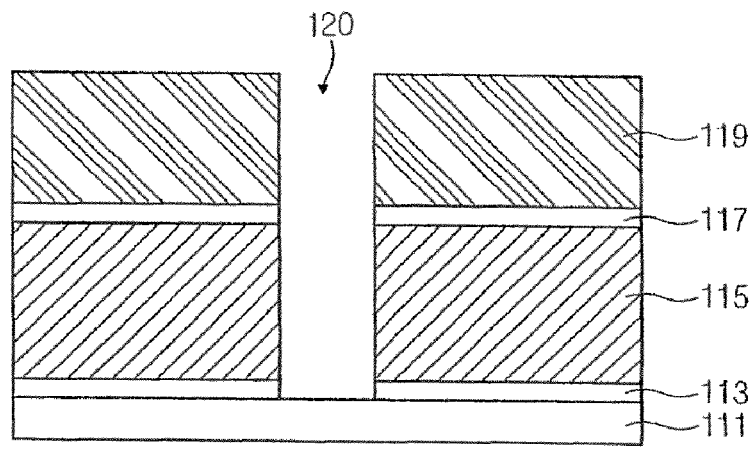
FIGS. 4a through 4e are cross-sectional diagram illustrating a method for forming a dual damascene pattern according to one embodiment consistent with the present invention.

An SAC insulating film 113, a first low dielectric film 115, a nitride film 117, and a second low dielectric film 119 are sequentially deposited over a hardwiring layer 111, and the resulting structure is etched to expose a part of hardwiring layer 111, thereby obtaining a via hole 120 (see FIG. 4a).

Any material having a low-K value can be used as second dielectric film 119. Second dielectric film 119 is selected from the group consisting of an oxide film, a spin-on glass (SOG) material, and a nitride film. The oxide film is selected from the group consisting of High Density Plasma (HDP) oxide, Borophosphosilicate Glass (BPSG), and Tetra-ethoxy-silicate glass (TEOS). The SOG material is selected from the group consisting of Hydrogen Silses-Quioxane (HSQ), Methyl Silses-Quioxane (MSQ), and Phenyl Silses-Quioxane (PSQ). The nitride film is selected from the group consisting of Silicon Oxynitride (SiON) and Silicon Rich Oxy-Nitride (SRON).

Figure 4B:
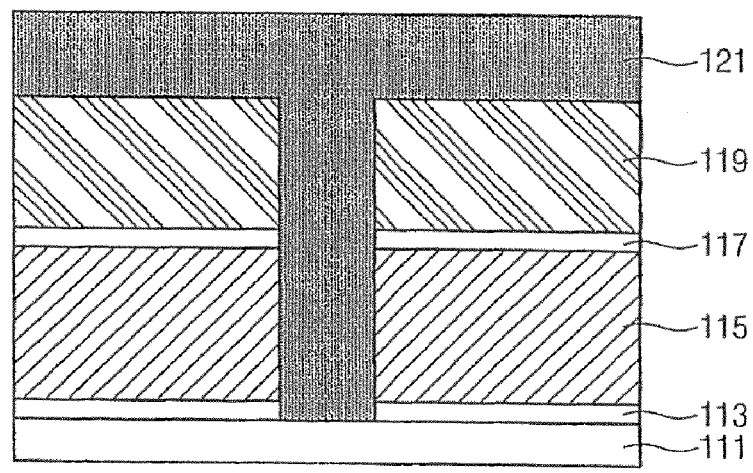

A multi-functional hard mask film 121 is formed on second dielectric film 119 and in via hole 120 by a spin-on coating method (see FIG. 4b).

A substrate reflectivity can be adjusted by optical constants, such as a refractive index (n) and an absorptivity (k), and a coating thickness of the material. A patterning process is facilitated by a low substrate reflectivity. However, while it is difficult to change the refractive index (n) due to its dependence on the main chain size of a polymer, the absorptivity or the coating thickness can be easily adjusted by the loading amount of chromophore. In order to lower the substrate reflectivity and increase the uniformity of a critical dimension, it is required to properly adjust the coating thickness of the multi-functional hard mask film.

For example, multi-functional hard mask film 121 may include a silicon resin present in an amount ranging from about 30 to 70 parts by weight based on the total weight of the composition as a main element, and has a refractive index ranging from about 1.6 to 1.8. The silicon resin contains silicon molecules present in an amount ranging from about 20 to 45 wt % based on the total weight of the resin. Multi-functional hard mask film 121 is formed to have the substrate reflectivity of less than 1%, preferably ranging from about 0.05 to 0.001%. Specifically, multi-functional hard mask film 121 is formed at a thickness ranging from about 300 to 1300 Å, preferably from about 300 to 500 Å or from about 800 to 1000 Å, more preferably from about 340 to 460 Å, to entirely fill via hole 120 and to reduce the substrate reflectivity.

It is not necessary to form an anti-reflection film in a subsequent process, because multi-functional hard mask film 121 controls the substrate reflectivity like a conventional anti-reflection film, thereby simplifying the process.

Due to coating effects of multi-functional hard mask film 121, a void or step coverage is not generated when a separated via hole region or a dense region is filled. Also, multi-functional hard mask film 121 is not intermixed with the photoresist material in an interface.

Figure 4C:
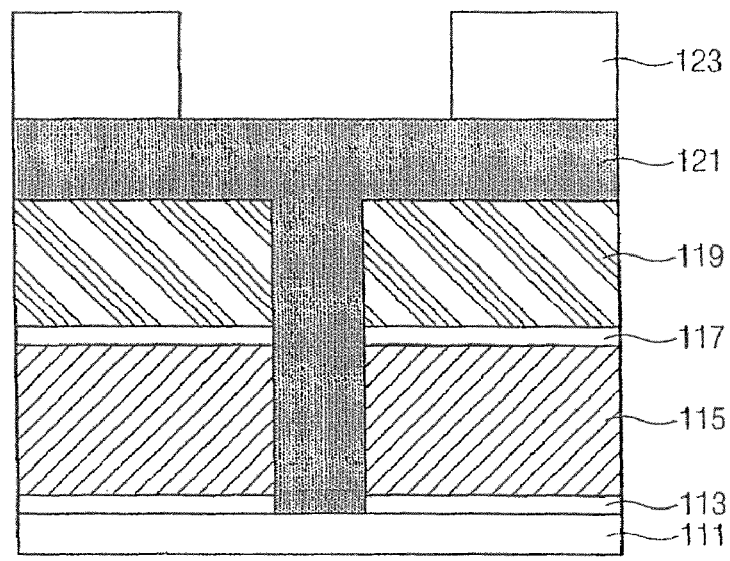

A photoresist pattern 123 is formed over a given region of multi-functional hard mask film 121 (see FIG. 4c).

Figure 4D:
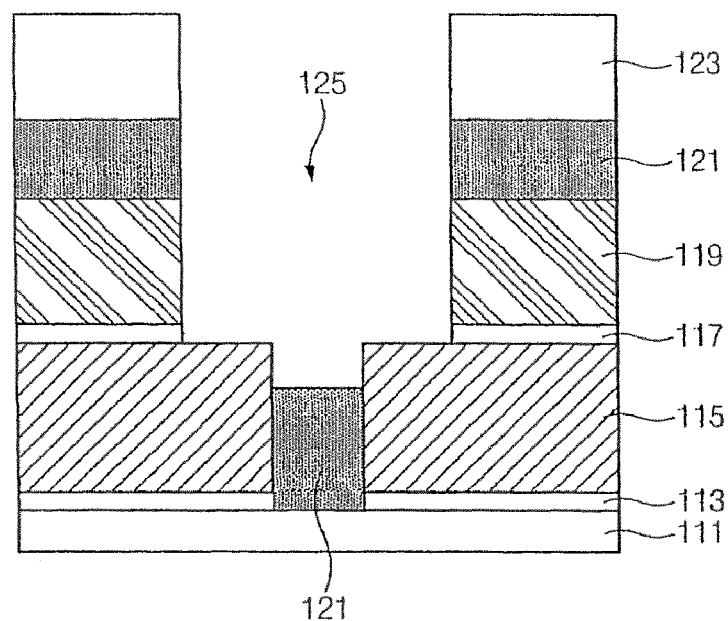
Figure 4E:
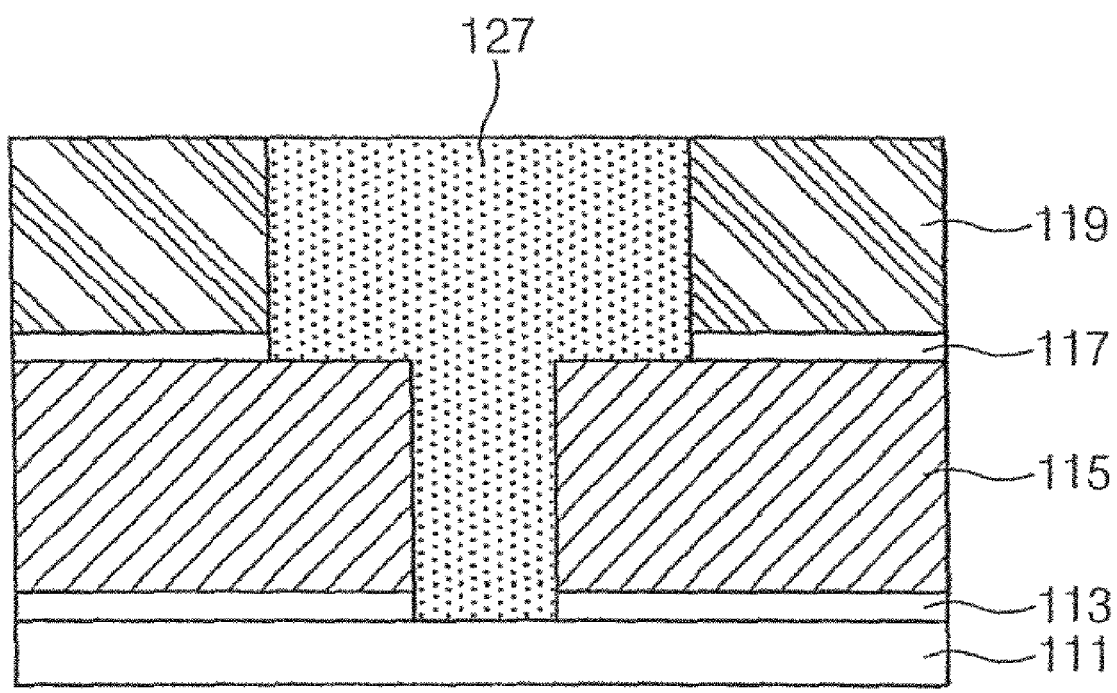

An etching process is performed on the resulting structure to expose a part of first dielectric film 115 using photoresist pattern 123 as an etching mask, thereby obtaining a trench 125 having a larger width than that of via hole 120 (see FIG. 4d).

Trench 125 is for forming a dual damascene pattern where a via trench and a conductive trench are deposited.

The etching process described above is performed using a plasma etching gas selected from the group consisting of $CF_4$, $C_4F_6$, $CH_2F_2$, $CHF_3$, $O_2$, Ar, and mixtures thereof as a source gas.

A strip process is performed on the resulting structure to remove photoresist pattern 123 and multi-functional hard mask film 121. A metal material 127 is filled in trench 125 to form a metal line (see FIG. 4e).

The strip process described above is performed by a wet method using a chemical such as a fluorine or alkali chemical.

Multi-functional hard mask film 121 may act as a gap fill material containing a large amount of silicon to control the substrate reflectivity, so as not to perform a process for forming an anti-reflection film, thereby simplifying the process.

The gap fill material used in a dual damascene process is required to have a proper etching speed in comparison with first and second dielectric films 115 and 119. When using multi-functional hard mask film 121 as a gap fill material, the etching rate can be adjusted depending on the silicon content.

When the etching speed of the gap fill material in the process for forming trench 125 is slower than that of second low dielectric film 119, defects such as a crown or a fence may be generated one the surface of second low dielectric film 119 in the trench, thereby degrading the deposition effect of seed layers or plating effect of metal materials. When the etching speed of the gap fill material in the trench process is faster than that of first low dielectric film 115, the lower part of via hole 120 may be etched to damage hardwiring layer 111. When a porous dielectric film is used as a low dielectric film, the etching speed of multi-functional hard mask film 121 may be required to be faster than when trench 125 is etched.

In one embodiment, multi-functional hard mask film 121 is used as a gap fill material by regulating the silicon content to obtain a proper etching rate, so that various types of low dielectric films can be used.

The above-described multi-functional hard mask film 121 will be described in detail by referring to examples below, which are not intended to limit the scope of the invention.

Example 1

Coating Experiment of a Multi-Functional Hard Mask

Ti/TiN/TiN (340 Å), tungsten (500 Å), and a hard mask nitride film (1500 Å) are deposited over a semiconductor substrate and etched to form a bit line pattern. A multi-functional hard mask film (NCH 087, Nissan Industrial Chemical) is spin-coated at a thickness of 1300 Å. A cross-section of the resulting structure is measured at a tilt angle of 60° and 90° using an SEM.

Figure 5A:
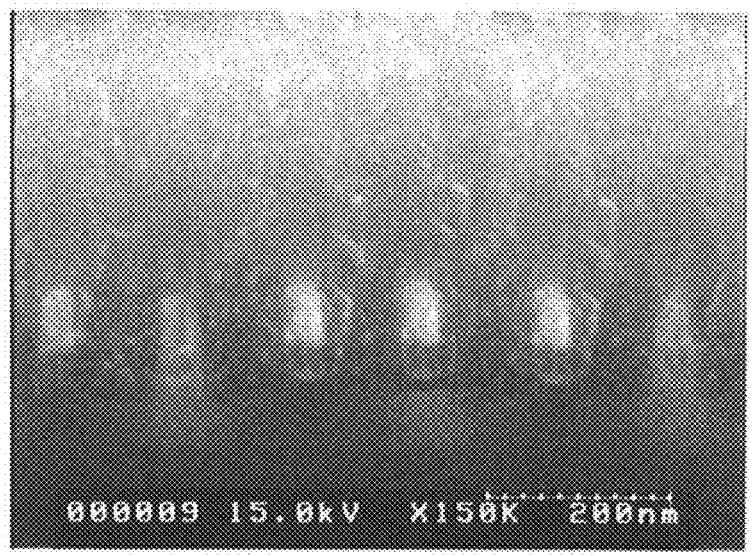
FIGS. 5a and 5b are scanning electron microscopy (SEM) photographs illustrating a resultant multi-functional hard mask film.
Figure 5B:
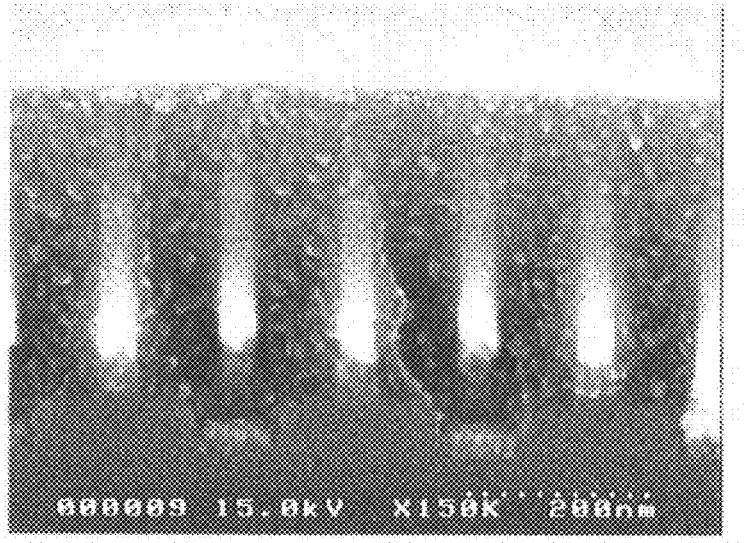

The multi-functional hard mask film is formed without any void at a 90° tilt angle (see FIG. 5a) and a 60° tilt angle (see FIG. 5b).

Example 2

Measurement of a Substrate Reflectivity after Coating of a Multi-Functional Hard Mask Film An HDP oxide film and a multi-functional hard mask film (NCH 087, Nissan Industrial Chemical) are deposited over an underlying layer to have a different thickness from each other. The multi-functional hard mask film is formed by a spin-coating method. The substrate reflectivity (axis Y) is measured depending on the absorptivity and the coating thickness (axis X) of the multi-functional hard mask. FIGS. 6a through 6d show the results.

When the coating thickness of the multi-functional hard mask film ranges from about 300 to 500 Å (k ranges from about 0.3 to 0.6) or from about 800 to 1000 Å (k ranges from about 0.2 to 0.5), the substrate reflectivity is less than 1.0%. When the coating thickness of the hard mask film formed over the low dielectric film ranges from about 340 to 640 Å, k ranges from about 0.4 to 0.5 (see FIGS. 6a through 6c).

Figure 6A:
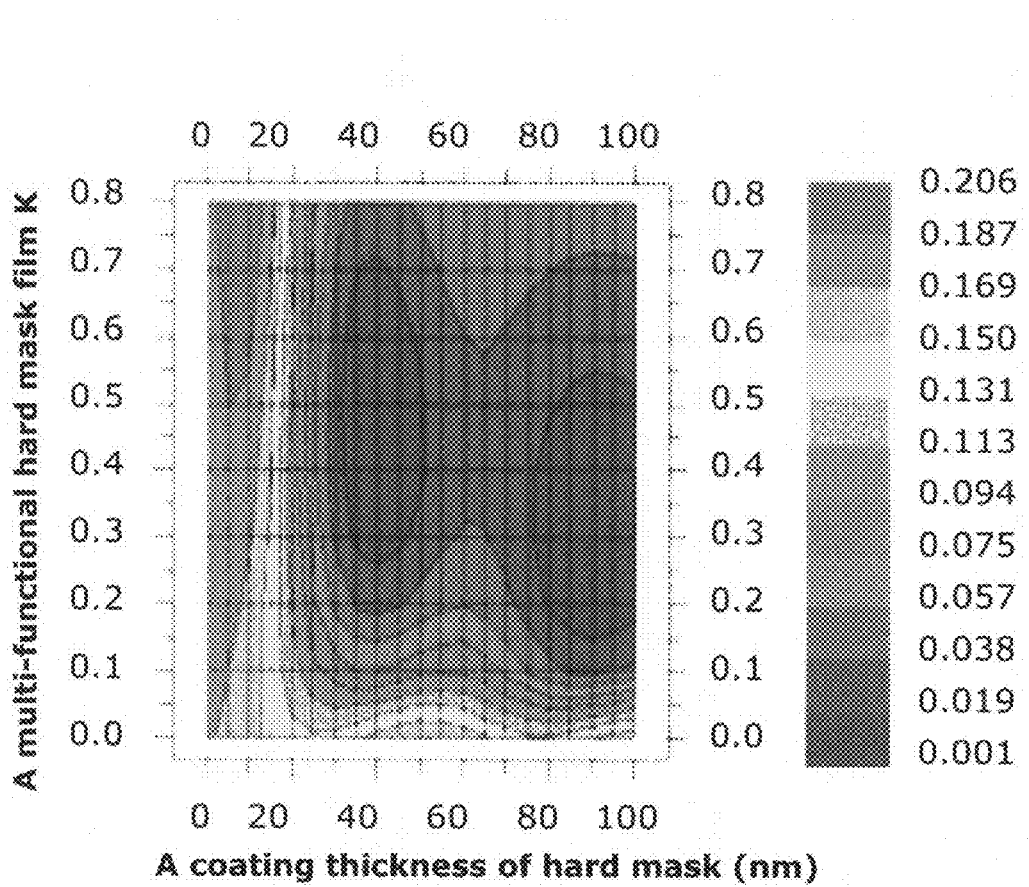
FIGS. 6a through 6d are diagrams illustrating reflectivity simulation of a substrate having the multi-functional hard mask film.
Figure 6B:
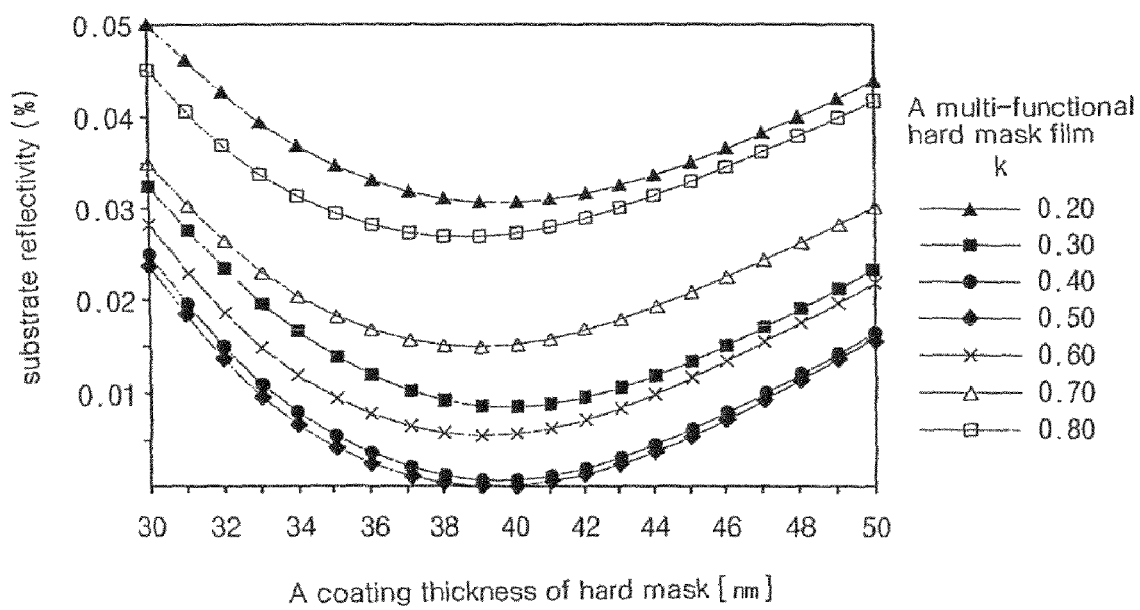
Figure 6C:
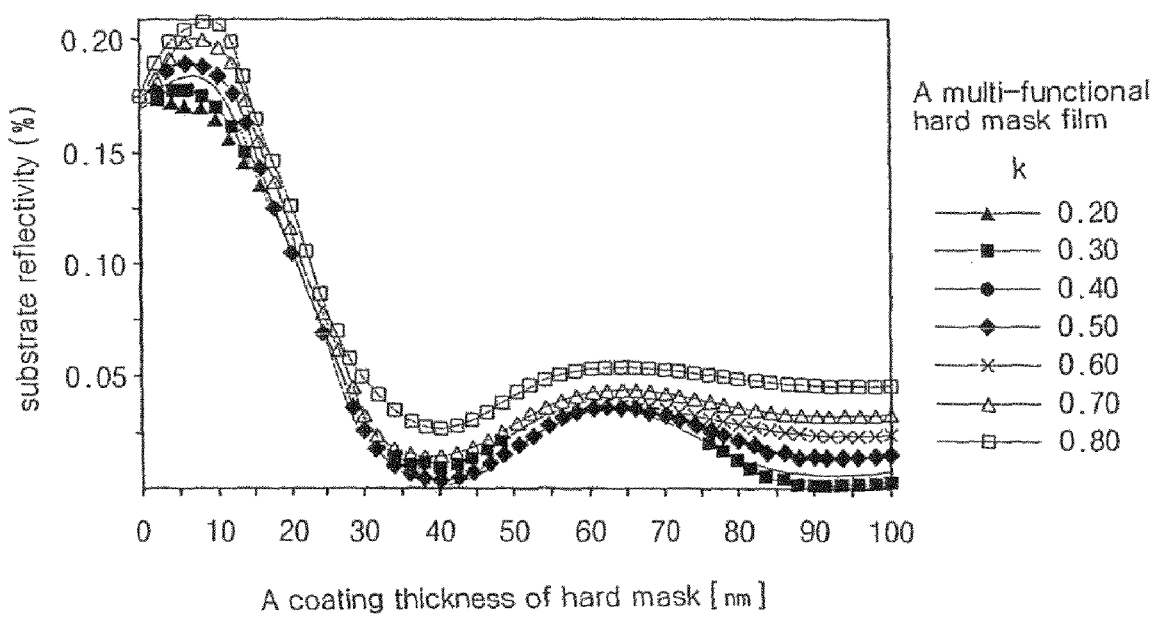
Figure 6D:
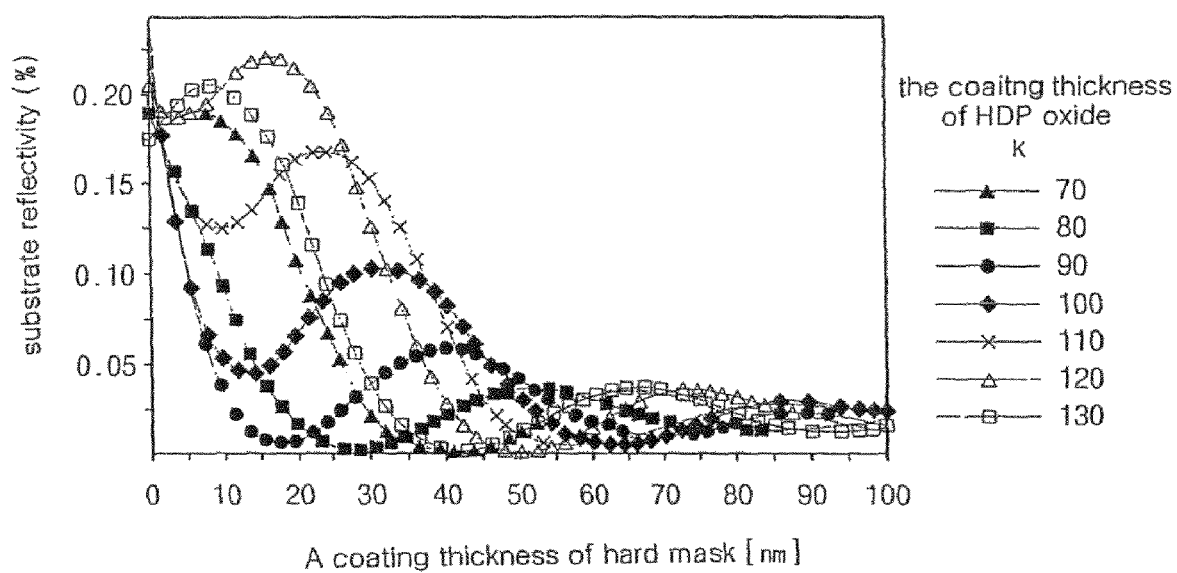

FIG. 6d shows an absorptivity value obtained by changing the coating thickness of the multi-functional hard mask film formed over the HDP oxide film. In order to obtain a stable patterning process condition, a proper coating thickness (over 300 Å) of the multi-functional hard mask is changed depending on the HDP thickness.

When the coating thickness of the multi-functional hard mask film formed over the low dielectric film is higher, the damage amount of photoresist is large during etching of the trench. As a result, a minimum coating thickness is required like an organic anti-reflection film.

As described above, according to an embodiment consistent with the present invention, a multi-functional hard mask material containing a large amount of silicon is used as a gap fill material in a dual damascene process. Because the multi-functional hard mask film has characteristics of a gap fill material and an anti-reflection film to regulate a substrate reflectivity, it is not necessary to form an anti-reflection film, thereby simplifying the process. Also, the silicon content included in the multi-functional hard mask film is regulated to obtain a proper etching rate of a low dielectric film.

The above embodiments of the present invention are illustrative and not limitative. Various alternatives and equivalents are possible. The invention is not limited by the lithography steps described herein. Nor is the invention limited to any specific types of semiconductor devices. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for forming a dual damascene pattern, the method comprising:
   preparing a multi-functional hard mask composition including a silicon resin as a base resin, wherein the silicon resin comprises about 20 to 45% silicon molecules by weight, based on a total weight of the resin;
   forming a deposition structure by sequentially forming a self-arrangement contact (SAC) insulating film, a first dielectric film, an etching barrier film, and a second dielectric film over a hardwiring layer;
   etching the deposition structure to expose the hardwiring layer, thereby forming a via hole;
   coating the multi-functional hard mask composition over the second dielectric film and in the via hole to form a multi-functional hard mask film; and
   etching the resulting structure to expose a part of the first dielectric film using a photoresist pattern as an etching mask, thereby forming a trench having a width greater than that of the via hole.

2. The method according to claim 1, further comprising:
   removing the multi-functional hard mask film; and
   filling a metal material in the trench to form a metal line.

3. The method according to claim 1, wherein the multi-functional hard mask composition comprises i) a silicon resin present in an amount ranging from about 30 to 70 parts by weight based on 100 parts by weight of the composition, and ii) a residual organic solvent as main elements; optionally iii) a compound represented by Formula 1 or Formula 2; and optionally iv) a thermal acid generator or a photoacid generator:

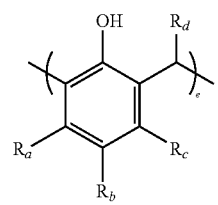

[Formula 1]

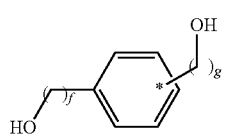

[Formula 2]

wherein $R_a$~$R_d$ are individually hydrogen, or a linear or branched $C_1$~$C_5$ alkyl group, which may be substituted, e is an integer ranging from 5 to 500, f is an integer ranging from 0 to 5, and g is an integer ranging from 1 to 5.

4. The method according to claim 3, wherein the molecular weight of the silicon resin ranges from about 300 to 30,000.

5. The method according to claim 3, wherein the compound represented by Formula 1 or Formula 2 is present in an amount ranging from about 20 to 200 parts by weight based on 100 parts by weight of the silicon resin.

6. The method according to claim 3, wherein the thermal acid generator or the photoacid generator is present in an amount ranging from about 1 to 20 parts by weight based on 100 parts by weight of the silicon resin.

7. The method according to claim 3, wherein the silicon resin includes one or more compounds selected from compounds represented by Formula 3 and Formula 4:

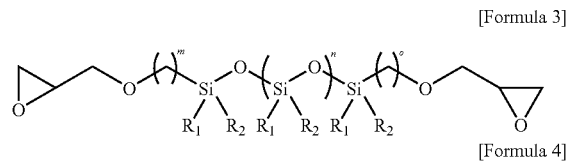

[Formula 3]

[Formula 4]

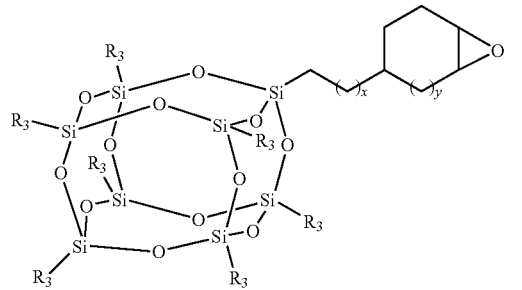

wherein $R_1$ and $R_2$ are individually hydrogen or a linear or branched $C_1$~$C_5$ alkyl group, which may be substituted; $R_3$ is hydrogen or a linear or branched $C_1$~$C_5$ alkyl group, which may be substituted, a $C_3$~$C_8$ cycloalkyl group, which may be substituted, or a $C_5$~$C_{12}$ aromatic group, which may be substituted; m, n and o are integers ranging from 1 to 10; and x and y are integers ranging from 0 to 5.

8. The method according to claim 3, wherein the organic solvent is selected from the group consisting of methyl 3-methoxypropionate, ethyl 3-ethoxypropionate, propyleneglycol methyletheracetate, cyclohexanone, 2-heptanone, ethyl lactate, and combinations thereof.

9. The method according to claim 3, wherein the thermal acid generator is a compound represented by Formula 8 or Formula 9:

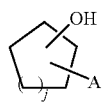
[Formula 8]

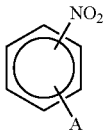
[Formula 9]

wherein A is a functional group including a sulfonic group, and n is 0 or 1.

10. The method according to claim 3, wherein the photoacid generator is selected from the group consisting of phthalimidotrifluoro methanesulfonate, dinitrobenzyltosylate, n-decyldisulfone, naphtylimidotrifluoro methanesulfonate, diphenyl p-methoxyphenyl sulfonium triflate, diphenyl p-toluenyl sulfonium triflate, diphenyl p-isobutylphenyl sulfonium triflate, triphenyl hexafluoro arsenate, triphenylhexafluoro antimonite, triphenylsulfonium triflate, and dibutylnaphtylsulfonium triflate.

11. The method according to claim 1, wherein the second dielectric film comprises at least one of an oxide film, a spin-on-glass material film, and a nitride film.

12. The method according to claim 11, wherein:
the oxide film is selected from the group consisting of High Density Plasma (HDP), Borophosphosilicate Glass (BPSG), and Tetra-ethoxysilicate glass (TEOS);
the spin-on-glass material is selected from the group consisting of Hydrogen Silses-Quioxane (HSQ), Methyl Silses-Quioxane (MSQ), and Phenyl Silses-Quioxane (PSQ); and
the nitride film is one of Oxynitride (SiON) or Silicon Rich Oxy-Nitride (SRON).

13. The method according to claim 1, wherein the multi-functional hard mask film has a refractive index ranging from about 1.6 to 1.8.

14. The method according to claim 1, wherein the multi-functional hard mask film is formed to have a coating thickness such that a substrate reflectivity is below 1%.

15. The method according to claim 14, wherein the substrate reflectivity ranges from about 0.05 to 0.001%.

16. The method according to claim 1, wherein the trench is formed by using a plasma etching gas selected from the group consisting of $CF_4$, $C_4F_6$, $CH_2F_2$, $CHF_3$, $O_2$, Ar, and mixtures thereof.

17. The method according to claim 1, wherein the removing-the-multi-functional-hard-mask comprises performing a wet etching process using a fluorine or alkali chemical.

* * * * *